United States Patent [19]

Sakamoto et al.

[11] Patent Number: 5,142,226

[45] Date of Patent: Aug. 25, 1992

[54] POSITION DETECTION DEVICE HAVING ABSOLUTE POSITION DETECTION APPARATUS AND INTERPOLATION APPARATUS

[75] Inventors: Kazuya Sakamoto, Akishima; Mitsuhiro Funatsu, Nagareyama, both of Japan

[73] Assignee: Kabushiki Kaisha SG, Tokyo, Japan

[21] Appl. No.: 401,979

[22] Filed: Sep. 1, 1989

[51] Int. Cl.⁵ ............................................. G01B 7/14
[52] U.S. Cl. ............................ 324/207.24; 324/207.18
[58] Field of Search ..................... 324/207.11, 207.23, 324/207.24, 207.25, 207.26; 340/870.31, 870.32, 870.35, 870.33, 870.36; 336/135; 310/168; 318/656-661

[56] References Cited

U.S. PATENT DOCUMENTS

| 4,109,200 | 8/1978 | McNulty | 324/207.18 |
| 4,450,443 | 5/1984 | Dolland | 324/207.18 X |
| 4,612,503 | 9/1986 | Shimizu et al. | 324/207.18 |
| 4,646,012 | 2/1987 | Feilchenfeld et al. | 324/207.24 X |
| 4,754,220 | 6/1988 | Shimizu et al. | 324/207.18 |
| 4,779,048 | 10/1988 | Aichele | 324/207.18 |
| 4,786,869 | 11/1988 | Kanai et al. | 324/207.18 |

FOREIGN PATENT DOCUMENTS

57-168061 10/1982 Japan.

Primary Examiner—Kenneth A. Wieder
Assistant Examiner—Warren S. Edmonds
Attorney, Agent, or Firm—Graham & James

[57] ABSTRACT

An absolute position detector samples and outputs a digital value of absolute position data of an object of detection at each predetermined sampling timing. An interpolation circuit interpolates between position data of different sampling timings provided by the absolute position detector, thereby to produce absolute position data at close intervals. Such arrangement produces absolute position data with a time resolution which is finer than the period of the sampling timing. A further circuit produces an incremental pulse train on the basis of the output of the interpolation circuit in correspondence to change in a value of interpolation for each interpolation step.

8 Claims, 5 Drawing Sheets

POSITION DETECTION DEVICE HAVING ABSOLUTE POSITION DETECTION APPARATUS AND INTERPOLATION APPARATUS

BACKGROUND OF THE INVENTION

This invention relates to a position detection device capable of producing absolute position data at a short period by interpolation and, more particularly, to a position detection device capable of producing incremental pulses at a short period on the basis of such interpolation.

Figure 6:
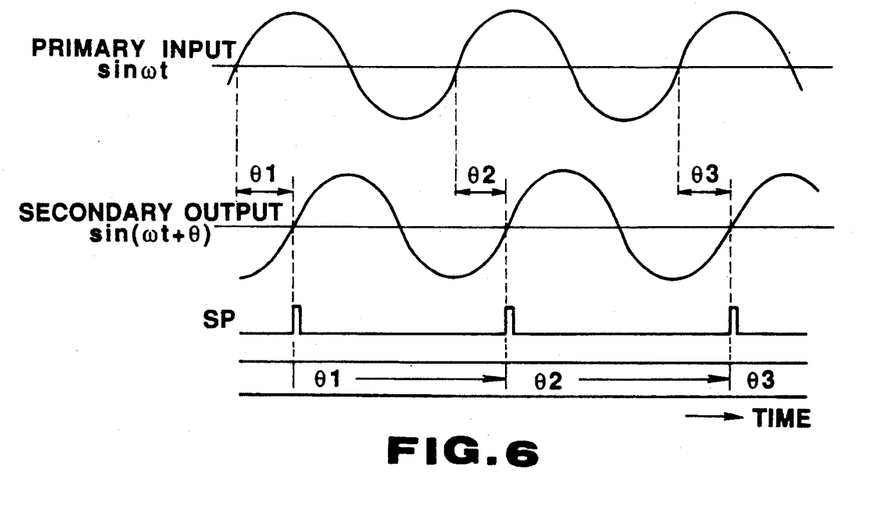
FIG. 6 is a time chart showing an example of detection operation of an absolute position detection device of a phase shift type.

In a position detection device of a phase shift type as disclosed by U.S. Pat. No. 4,754,220, a secondary output signal $\sin(\omega t + \theta)$ is obtained by shifting the electrical phase angle of a primary ac signal $\sin \omega t$ by an angle $\theta$ corresponding to a position of an object of detection as shown in FIG. 6 for example, and data 1, 2, 3, ... of the phase shift amount in this secondary output signal are sampled and held at each period to provide absolute position data of the object of detection. For example, the phase angle is counted from a predetermined phase angle (e.g., 0) of the primary ac signal $\sin \omega t$ to a predetermined phase angle (e.g., 0) of the secondary output signal $\sin(\omega t + \theta)$ and each count is sampled and held at each sampling timing synchronized with one period of the phase angle (by a sampling pulse SP). In this case, when the object of detection is at a standstill at a certain position, data $\theta 1, \theta 2, \theta 3, \ldots$ do not change, indicating the position at which the object is at a standstill. When the object of detection is moving, data $\theta 1, \theta 2, \theta 3, \ldots$ obtained at each sampling timing in correspondence to current position of the object of detection at each sampling timing undergo change. The minimum time unit of this change is each sampling timing.

Such position detection device of a phase shift type is generally an absolute position detection device which does not produce an incremental pulse.

There is an example, as disclosed by Japanese Preliminary Utility Model Publication No. 57-168061, in which an incremental pulse is generated by an absolute position detection device. In this device, an incremental pulse is generated in synchronism with a sampling pulse SP of each period of the secondary output signal. The capability of generation of an incremental pulse by an absolute position detection device provides the advantage that applications of the position detection device increase, for the device can be utilized for a control device using an incremental pulse while enjoying advantages proper to the absolute position detection device.

On the other hand, as a known device for generating an incremental pulse, there is a known optical type incremental encoder which reads s pulse pattern of a rotary code plate in an optical manner.

In the above described position detection device of a phase shift type, the minimum time unit of change of absolute position detection data is limited to one period of the sampling pulse SP. As a result, if the speed of moving of the object of detection is high, the value of output absolute position detection data is dispersed with resulting reduction in accuracy. In other words, movement of the object of detection cannot be detected during one period of the sampling pulse SP, however large the distance of movement of the object of detection may be, and this adversely affects accuracy of detection. If, particularly, output of this position detection device is supplied to a control device for utilization therein, resolution of change time of position data supplied from the position detection device to the control device should be as fine as possible from the standpoint of preventing occurrence of beat, since an operation clock of the control device is not synchronized with the sampling timing of the position detection device at all. It is therefore undesirable that the resolution of change time of position data should be limited to one period of the sampling pulse SP as described above.

In generating an incremental pulse by using an absolute position detection device, the system as disclosed by the above mentioned Preliminary Utility Model Publication No. 57-168061 in which an incremental pulse is generated in synchronism with the sampling pulse SP is undesirable because resolution of the incremental pulse is limited to one period of the sampling pulse SP. For this reason, in said Preliminary Utility Model Publication No. 57-168061, it is made one of conditions of detection that the speed of the object of detection should be below a predetermined speed. This however reduces speed response characteristic of the position detection device. If this position detection device is applied to a speed which exceeds the limited speed response characteristic of the device, some pulses will be dropped from the incremental pulse train produced with a result that the number of pulses does not correspond exactly to the amount of displacement.

The known optical type incremental encoder is limited in its speed response characteristic due to its limited pulse production ability. Such incremental encoder generally has a speed response of only about 50 kHz and the speed response cannot be increased to more than about 200 kHz even if the speed response is increased to the highest possible order.

SUMMARY OF THE INVENTION

It is, therefore, an object of the invention to provided a position detection device including absolute position detection means for sampling and outputting a digital value of absolute position data of an object at each predetermined sampling timing which can produce absolute position data with a time resolution which is finer than the period of the sampling timing and also can produce an incremental pulse which is of the same high resolution as the time resolution.

The position detection device achieving the above object of the invention comprises absolute position detection means for sampling and outputting a digital value of absolute position data of an object of detection at each predetermined sampling timing and interpolation means for interpolating between position data of different sampling timings provided by said absolute position detection means thereby to produce absolute position data at close intervals.

The position detection device according to the invention further comprises incremental data generation means for forming and producing an incremental pulse train on the basis of the output of said interpolation means.

According to the invention, by interpolating position data of different sampling timings by the interpolation means, absolute position data can be produced at a short period so that the absolute position data can be produced with a time resolution which is finer than the period of the sampling timing. Besides, by forming and outputting an incremental pulse train on the basis of the output of the interpolation means, an incremental pulse train of a high resolution which, as the absolute position data is, equivalent to the interpolation step can be generated. Besides, in this device, a speed response characteristic can be made as high as the clock used for the interpolation operation permits.

Embodiments of the invention will now be described with reference to the accompanying drawings.

BRIEF DESCRIPTION OF THE DRAWINGS

In the accompanying drawings.

DESCRIPTION OF PREFERRED EMBODIMENTS

Figure 1:
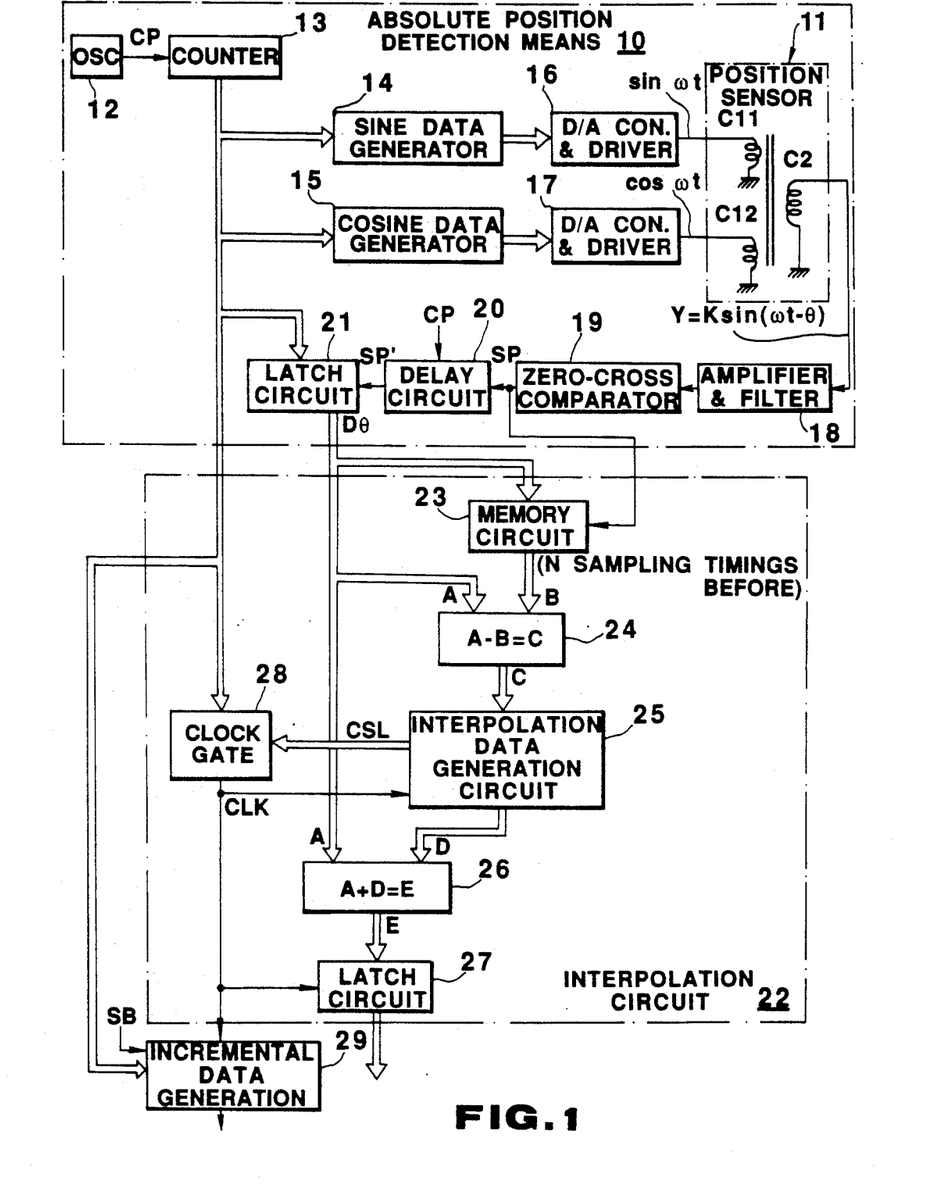
FIG. 1 is a block diagram showing an embodiment of the position detection device according to the invention.

Referring to FIG. 1, absolute position detection means 10 samples and outputs a digital value of absolute position data of an object of detection at each predetermined sampling timing. The absolute position detection means 10 comprises a variable reluctance type position sensor 11 which, as disclosed for example in the above mentioned U.S. Pat. No. 4,754,220, comprises primary coils C11 and C12 which are excited by ac signals which are different in phase from each other and a secondary coil C2. This position sensor 11 may be of a rotary type or linear type. A master clock pulse CP of a predetermined frequency (e.g., 1 MHz) is oscillated by an oscillator 12 and is applied to a counter 13 to be counted thereby. The output of the counter 13 is applied to a sine data generator 14 and a cosine data generator 15 which generate respectively data of sine and cosine functions. The data of sine and cosine functions are respectively applied to digital-to-analog conversion and driving circuits 16 and 17 for generation of an analog sine signal sin ωt and an analog cosine signal cos ωt. The sine signal sin ωt and cosine signal cos ωt are applied respectively to the primary coils C11 and C12 of the position sensor 11 as exciting reference ac signals. A period in which the count of the counter 13 completes one period is adapted to correspond to one period of the exciting reference ac signals sin ωt and cos ωt. In other words, one period of the reference ac signal sin ωt is completed while the count of the counter 13 changes from all "0" to all "1".

In the position sensor 11, reluctance corresponding to each of the primary coils C11 and C12 changes in accordance with the position of the object of detection and an output signal $Y = K \sin(\omega t - \theta)$ obtained by phase modulation made in accordance with this position is provided from the secondary coil C2. The phase difference $\theta$ from the primary ac signals in this output signal Y corresponds to the position of the object of detection so that absolute position data of this object can be measured by measuring this phase difference $\theta$. For this purpose, the output signal Y of the position sensor 11 is applied to a zero-cross comparator 19 through an amplifier and filter 18 for detection of a zero-cross phase, i.e., phase angle 0. A signal which is generated in synchronism with the detection timing of this phase angle 0 of the output signal Y is applied as the sampling pulse SP to a latch control input of a latch circuit 21 through a delay circuit 20. The delay circuit 20 is provided for forming a sampling pulse SP' which has a slight delay to the sampling pulse SP. The output count of the counter 13 is latched by the latch circuit 21 in response to this sampling pulse SP'. In this manner, measured data D $\theta$ of the phase difference $\theta$ corresponding to the current position of the object of detection is latched by the latch circuit 21. That is, the output of the latch circuit 21 constitutes current absolute position data of the object of detection. The minimum unit of change timing of the absolute position data provided by the latch circuit 21 is timing of the sampling pulse SP, i.e., period of time corresponding to one period of the output signal Y of the position sensor 11. The foregoing description applies also to the time chart of FIG. 6.

An interpolation circuit 22 is provided for interpolating between position data of different sampling timings provided by the latch circuit 21 and thereby producing absolute position data at a short interval. A memory circuit 23 receives the output of the latch circuit 21 and stores data of N sampling timings before the data currently produced by the latch circuit 21. The sampling pulse SP provided by the zero-cross comparator 19 is applied to the memory circuit 23 as a load control signal. The memory circuit 23 is constructed of a latch or shift register and stores data for N sampling timings in response to the sampling pulse SP. If, for example, N is 1, the memory circuit 23 may be constructed of a simple latch. For storing in the memory circuit 23 of position data which was previously stored in the latch circuit 21 immediately before storing of position data of new sampling timing in the latch circuit 21 in response to the sampling pulse SP', the timing of the sampling pulse SP occurs slightly before the timing of the sampling pulse SP'.

Position data A of current sampling timing provided by the latch circuit 21 and position data B of N sampling timings before provided by the memory circuit 23 are applied to an operator 24 where arithmetic operation of $A - B = C$ is made. By this operation, difference C between the position data B of N samplings before and the position data A of the current sampling timing is obtained. The data of this difference C is applied to an interpolation data generation circuit 25. The circuit 25 generates position interpolation data D for each interpolation step in one period of the sampling timing on the basis of this data of difference D. This position interpolation data D for each interpolation step is applied to an operator 26 where it is added to the position data A of the current sampling timing provided by the latch circuit 21. That is, this position intrepolation data D is used as estimated change vlaue data for each step from current sampling timing to next sampling timing. In this manner, absolute position data E ($E = A + D$) in which the position data from current sampling timing to next sampling timing is interpolated is provided by the operator 26 at a short interval, i.e., at each interpolation step.

The absolute position data E which has been interpolated and provided by the operator 26 is applied to a latch circuit 27. In the meanwhile, the interpolation data generation circuit 25 generates a clock selection signal CSL in accordance with the number of interpolation steps in one period of the sampling timing to supply this signal CSL to a clock gate 28. The clock gate 28 selectively outputs, as a clock pulse CLK, a signal of a bit which has been selected by the clock selection signal CSL among respective bits of the count value data provided by the counter 13. This clock pulse CLK which has been selectively provided from the clock gate 28 corresponds to timing of each interpolation step. The latch circuit 27 is latch-controlled by the clock pulse CLK and latches interpolated absolute position data E for each interpolation step in synchronism with this clock pulse CLK.

Output signals of plural bits from the latch circuit 27 constitute absolute position data which are produced at a short interval by the interpolation.

The clock pulse CLK corresponding to the timing of each interpolation step is supplied also to an incremental data generation circuit 29. The incremental data generation circuit 29 generates an incremental pulse train in response to this clock pulse CLK and, if necessary, the count output from the counter 13 and a sign signal SB indicating the direction of movement of the object of detection. The incremental data generation circuit 29 produces, for example, a frequency divided output obtained by frequency-dividing the clock pulse CLK by two as an incremental pulse train of phase A and also forms a pulse train which is delayed from the incremental pulse train of phase A by 90 degrees and provides this pulse train as an incremental pulse train of phase B. The incremental data generation circuit 29 also detects origin from the value of absolute position data and thereby produces an origin pulse. Alternatively, absolute position data provided by the latch circuit 27 may be applied to the incremental data generation circuit 29 and an incremental pulse train may be generated on the basis of this absolute position data (for example, data of the least significant bit LSB in this absolute position data may be provided as the incremental pulse) train.

Figure 2A:
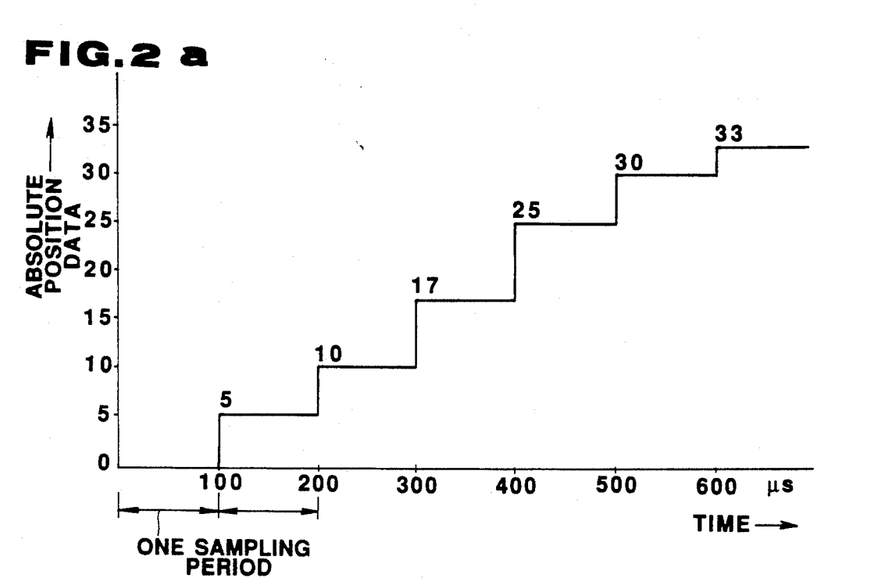
FIGS. 2a-2c is a time chart showing an example of the interpolation operation and production of an incremental pulse train in the same embodiment.
Figure 2B:
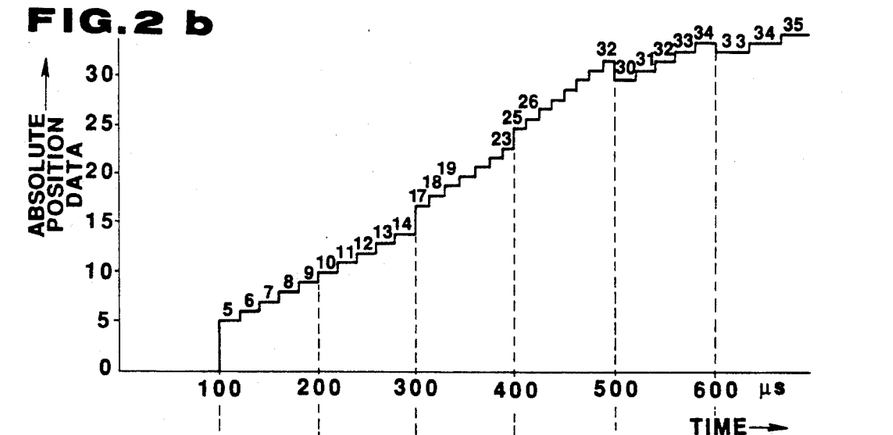
Figure 2C:
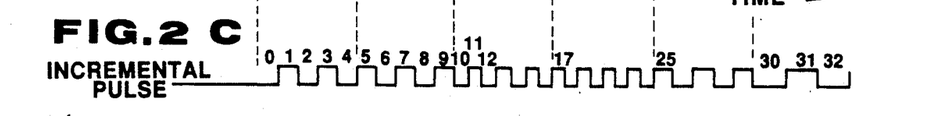

According to the above described circuit construction, if, as shown in FIG. 2a, absolute position data has been detected by the absolute position detection means 10 at each sampling timing having a period of 100 s, interpolated absolute position data as shown in FIG. 2b is produced at a short interval by the estimated interpolation by the interpolation circuit 22. On the basis of this output from the interpolation circuit 22, an incremental pulse train as shown in FIG. 2c is obtained. In this example, N is made 1 and data which is one sampling timing before data provided by the latch circuit 21 is provided by the memory circuit 23. When position data "5" of the first sampling timing is latched by the latch circuit 21, data provided by the memory circuit 23 is "0" and the output C of the operator 24 is "5". By a processing by the interpolation data generation circuit 25 corresponding to this, one period of the first sampling timing is divided into five interpolation steps and data "0", "1", "2", "3" and "4" are successively produced as position interpolation data D for each interpolation step. Each of these position interpolation data D is added to the position data "5" from the latch circuit 21 in the operator 26 so that data "5", "6", "7", "8" and "9" are successively produced as interpolated absolute position data at each interpolation step. The same processing is performed at next sampling timing and interpolated absolute position data is produced at a short interval as shown in FIG. 2b. Further, on the basis of the output of the interpolation circuit 22 (clock pulse CLK or interpolated absolute position data), an incremental pulse as shown in FIG. 2c is formed by the incremental data generation circuit 29 in correspondence to the interpolation step. Thus, the incremental pulse can be generated with the same accuracy as the resolution of the interpolated absolute position data and, accordingly, the problem of occurrence of dropped pulses is prevented, no matter how fast the object of detection is moving.

A specific example of the interpolation data generation circuit 25 will now be described with reference to FIG. 3.

Figure 3:
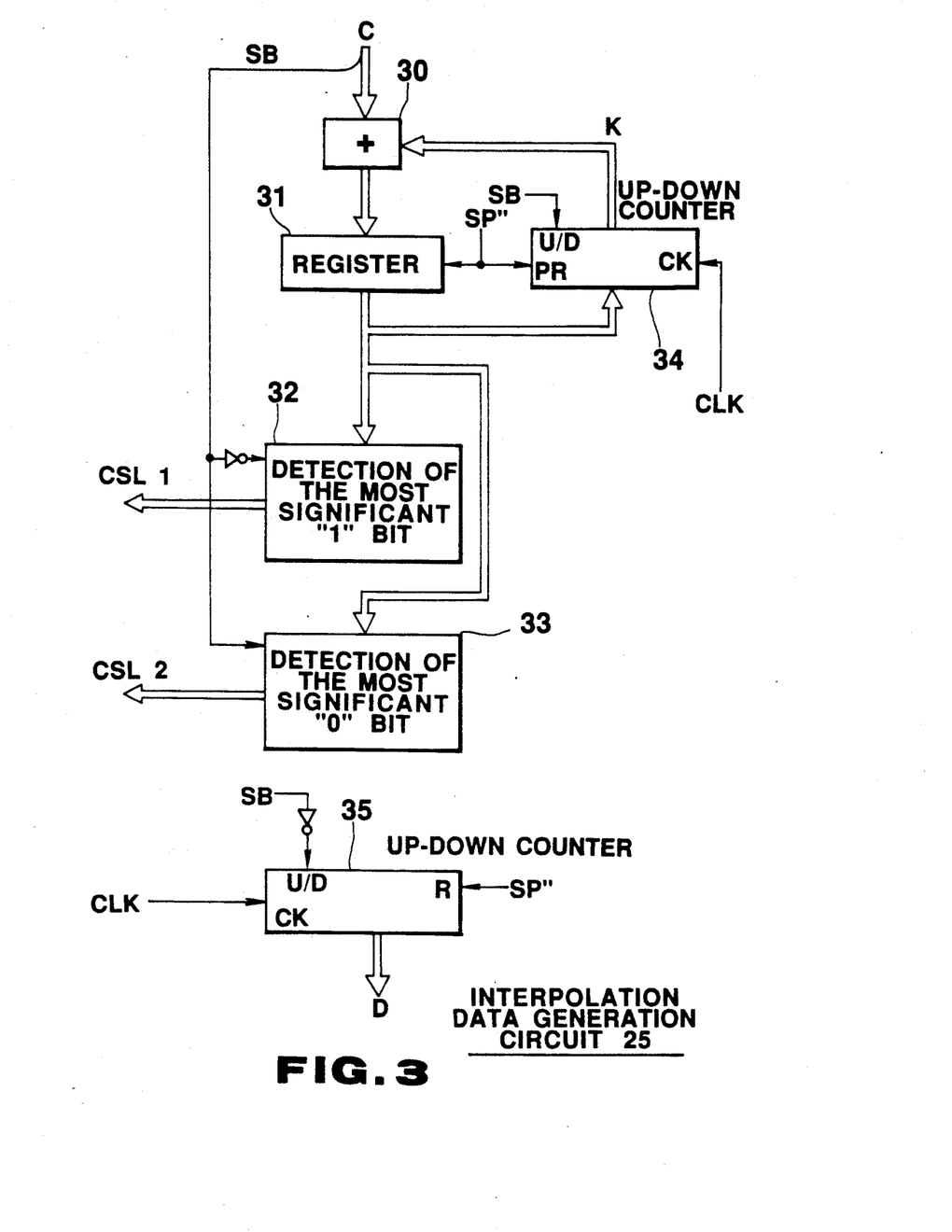
FIG. 3 is a block diagram showing a specific example of the interpolation data generation circuit in FIG. 1.

In the interpolation data generation circuit 25 shown in FIG. 3, output signals of respective bits of the counter 13 (FIG. 1) are assumed to be clock pulses and the clock selection signal CSL for selecting one of these clock pulses is generated in accordance with the number of interpolation steps in one period of sampling timing. Further, the interpolation data generation circuit 25 receives the clock pulse CLK selected by the clock gate 28 in response to this clock selection signal CSL and produces position interpolation data D in response to this clock pulse CLK. In this case, the number of interpolation steps is determined by the data of the difference C supplied from the operator 24 (FIG. 1). It is desirable that one period of sampling timing should be divided by a number equal to the difference C at equal interval to establish interpolation steps of the number corresponding to the difference C. Since, however, the clock pulse for establishing the interpolation step is the output signal of the counter 13 of FIG. 1, its frequency is limited and the number of dividing one period of sampling timing, i.e., the number of interpolation steps, is limited to $2^n$. In this interpolation data generation circuit 25 of FIG. 3, therefore, the difference C provided by the operator 24 is rounded to $2^n$ and the clock selection signal CSL (more specifically, either CSL1 or CSL2) is generated in accordance with the value of $2^n$ for selection of the clock pulse CLK with a fraction k ($k = C - 2^n$) produced by rounding of the difference C being carried to the value of difference C in next sampling timing.

In FIG. 3, data of the difference C provided by the operator 24 is applied to a register 31 through an adder 30 and then to selection signal generation logics 32 and 33. To another input of the adder 30 is applied a count output of a counter 34 but it is assumed that initially this count is "0". Accordingly, a value corresponding to the difference C is initially loaded in the register 31. To a load control input of the register 31 is applied a sampling pulse SP'' obtained by slightly delaying the sampling pulse SP' by the operation time of the operator 24.

The selection signal generation logics 32 and 33 round data corresponding to the difference C produced by the register 31 to $2^n$ and generate the clock selection signal CSL1 or CSL2 in accordance with the value of the rounded $2^n$.

The difference $C = A - B$ between the position data B of N sampling timings before and the position data A of current sampling timing has a positive or negative sign corresponding to the direction of movement of the object of detection (the direction of rotation in the case of a rotary shaft), since position data obtained by the absolute position detection means 10 is absolute position data. The data of the difference C provided by the operator 24 therefore is accompanied by the sign signal (i.e., code bit) SB. For example, this sign signal SB indicates a movement in positive direction when it is "0" and a movement in negative direction when it is "1". When the sign signal SB is "1" indicating the movement in negative direction, data of the difference C is a negative value which is represented by 2's complement.

The selection signal generation logic 32 for the positive direction is enabled when the sign signal SB is "0" to detect the most significant "1" bit among data provided by the register 31 and thereupon generate the clock selection signal CSL1. If, for example, data provided by the register 31 is "0 0 0 0 0 1 1 0", the clock selection signal CSL1 is generated in correspondence to the third bit from LSB, i.e., the bit having weight of $2^2$.

The selection signal generation logic 33 for the negative direction is enabled when the sign signal SB is "1" to detect the most significant "0" bit among data provided by the register 31 and thereupon generate the clock selection signal CSL2. If, for example, data provided by the register 31 is "1 1 1 1 0 0 1 0", the clock selection signal CSL2 is generated in correspondence to the fourth bit form LSB, i.e., the bit having weight of $2^3$.

In this manner, the selection signal generation logics 32 and 33 round data of the difference C in the register 31 to the value of $2^n$ and generate the clock selection signal CSL1 or CSL2 in accordance with the rounded value of $2^n$.

The clock gate 28 (FIG. 1) selects the output bit of the counter 13 in accordance with the weight of the given clock selection signal CSL1 or CSL2 under the relation shown in Table 1 below and provides the selected bit as the clock pulse CLK.

An example of clock period in each output bit of the counter 13 is shown here. Period of data of the most significant bit of the counter 13 corresponds to one period of the above described exciting reference ac signals sin ωt and cos ωt and this period is made, for example, 100 μs. If the counter 13 is an 8-bit binary counter, periods of output pulses of respective bits are as shown in Table 1. One period of sampling timing is 100 μs which is about the same as one period of the exciting reference ac signals (actually, when the object of detection is moving, the frequency of the output signal Y of the position sensor 11 deviates slightly from the frequency of the exciting signals in a positive or negative direction in accordance with its speed and direction).

TABLE 1

| when SB = "0" CSL1 | when SB = "1" CSL2 | weight of selected output of counter 13 and period of clock pulse CLK | |
|---|---|---|---|
| $2^0$ | | $2^7$ | 100. μs |
| $2^1$ | $2^0$ | $2^6$ | 50. |
| $2^2$ | $2^1$ | $2^5$ | 25. |
| $2^3$ | $2^2$ | $2^4$ | 12.5 |
| $2^4$ | $2^3$ | $2^3$ | 6.25 |
| $2^5$ | $2^4$ | $2^2$ | 3.125 |
| $2^6$ | $2^5$ | $2^1$ | 1.5625 |
| $2^7$ | $2^6$ | $2^0$ | 0.78125 |

If, for example, the value of data of the register 13 is "6" in decimal notation (binary "0 0 0 0 0 1 1 0") and the clock selection signal CSL1 has been generated in correspondence to the bit having the weight of $2^2$, the clock pulse CLK of the period of 25 μs is selected from the bit having the weight of $2^5$ of the counter 13 according to Table 1. This means that four pulses are generated in one period (100 μs) of sampling timing and, accordingly, one period of sampling timing is divided into four interpolation steps by this clock pulse CLK. Alternatively stated, data "6" of the difference C of the register 31 has been rounded to $2^2=4$ and the number of interpolation steps corresponding to this rounded "4" has been established.

If, as described above, the value of data of the register 31 is "−14" in decimal notation (binary "1 1 1 1 0 0 1 0") and the clock selection signal CSL2 has been generated in correspondence to the bit having the weight of $2^3$, the clock pulse CLK of the period of 6.25 μs is selected from the bit having the weight of $2^3$ of the counter 13 according to Table 1. This means that sixteen pulses are generated in one period = 100 μs of sampling timing and, accordingly, one period of sampling timing is divided into sixteen interpolation steps. Alternatively stated, data "−14" of the difference C of the register 31 has been rounded to $-2^4 = -16$ and the number of interpolation steps corresponding to the rounded "16" has been established.

An up-down counter 35 receives the clock pulse CLK selected by the clock gate 28 at its count input CK and receives a signal obtained by inverting the sign signal SB at its up-down control input U/D. When the sign signal SB is "0", i.e., the direction of movement of the object of detection is positive, an up mode is brought about whereby the clock pulse CLK is up-counted. When the sign signal SB is "1", i.e., the direction of movement of the object of detection is negative, a down mode is brought about whereby the clock pulse CLK is downcounted. This up-down counter 35 is reset by the sampling pulse SP" at the beginning of one period of sampling timing. Contents of counting by this up-down counter 35 are provided as the position interpolation data D. This position interpolation data D is a negative value consisting of 2's complement when the direction of movement of the object of detection is negative. If, for example, a suitable delay processing is introduced so that the beginning of one period of the clock pulse CLK is synchronized with the sampling pulse SP" and the count is maintained at "0" during about one period of the clock pulse CLK from resetting of the up-down counter 35 by the sampling pulse SP", "0" can be provided as the position interpolation data D in the first interpolation step and this will be convenient for the interpolation operation processing.

An up-down counter 34 receives the clock pulse CLK selected by the clock gate 28 at its count input CK, the sign signal SB at its up-down control input U/D, the sampling pulse SP" at its preset control input PR and the output of the register 31 at its preset data input. It is assumed that there is no time delay between input and output of the register 31 and therefore simultaneously with loading data in the register 31 in response to the sampling pulse SP", the same data is preset in the counter 34. Conversely to the up-down counter 35, the up-down counter 34 is brought into a down mode when the sign signal SB is "0", i.e., the direction of movement of the object of detection is positive thereby downcounting the clock pulse CLK from the preset value. When the sign signal SB is "1", i.e., the direction of movement of the object of detection is negative, the up-down counter 34 is brought into an up mode thereby upcounting the clock pulse CLK from the preset value. The contents of counting by the counter 34 are supplied to the adder 30 to be added to the data of the difference C provided by the operator 24 (FIG. 1) and result of the addition is stored in the register 31.

This up-down counter 34 is provided for obtaining the fraction k produced by the above described rounding operation ($k = C - 2^n$). The data of the fraction k provided by this counter 34 is supplied to the adder 30 to be added to data of the difference C in next sampling timing so as to carry the fraction k. By carrying of the fraction k, an error produced by the rounding can be removed.

Figure 4:
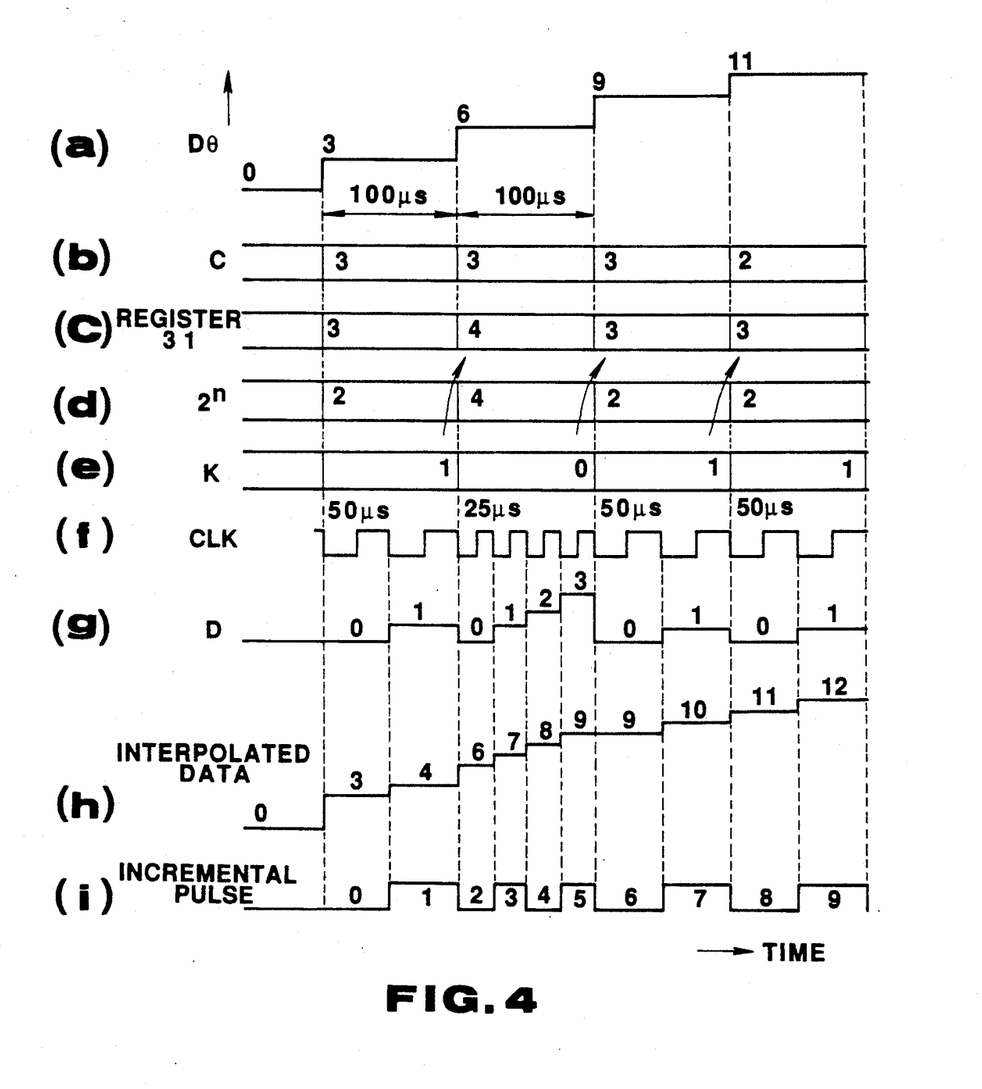
FIGS. 4(a)-(i) is a time chart showing an example of operation of the circuit of FIG. 3.

An example of input and output signals in the respective circuits of FIGS. 1 and 3 is shown in FIG. 4. It is now assumed that absolute position data D provided by the absolute position detection means 10 changes at each sampling timing as shown in FIG. 4-(a). The difference C provided by the operator 24 becomes as shown in FIG. 4-(b) and the contents of the register 31 of FIG. 3 become as shown in FIG. 4-(c). FIG. 4-(d) shows a value obtained by rounding the contents of the register 31 by $2^n$. FIG. 4-(e) shows the fraction k produced by the rounding, i.e., the output of the counter 34 of FIG. 3 at the end of one period of sampling timing. FIG. 4-(f) shows an example of the clock pulse CLK selected according to Table 1 in response to rounded value 2, i.e., the clock selection signal CSL. FIG. 4-(g) shows an example of the output of the counter 35 responsive to the clock pulse CLK, i.e., position interpolation data D. FIG. 4-(h) shows an example of a value obtained by adding the position interpolation data D to current absolute position data D, i.e., interpolated absolute position data provided by the latch circuit 27 (FIG. 1). FIG. 4-(i) shows an example of incremental pulse provided by the incremental data generation circuit 29 (FIG. 1) in response to the clock pulse CLK.

In FIG. 4-(i), accumulated number of incremental pulse is described. Comparing this accumulated number of incremental pulse with FIG. 4-(h), the accumulated number of incremental pulse is delayed from the value of the interpolated absolute position data by about one period of sampling timing. For compensating for this delay, a suitable processing may be made such, for example, as performing the above described interpolation operation by adding to the difference C a value obtained by subtracting the accumulated value of the incremental pulse from current absolute position data $D\theta$. The manner of generation of the incremental pulse may otherwise vary as the circuit design requires.

In the interpolation data generation circuit 25 shown in FIG. 3, the value of the difference C is rounded in accordance with the frequency of the output clock of the counter 13 whereby the circuit design is simplified. On the other hand, delay is produced by carrying of the fraction k. In another specific example of the interpolation data generation circuit 25 shown in FIG. 5, carrying of the fraction k is omitted by dividing one period of sampling timing at substantially equal interval by the difference C and thereby establishing interpolation steps of number corresponding to the difference C.

Figure 5:
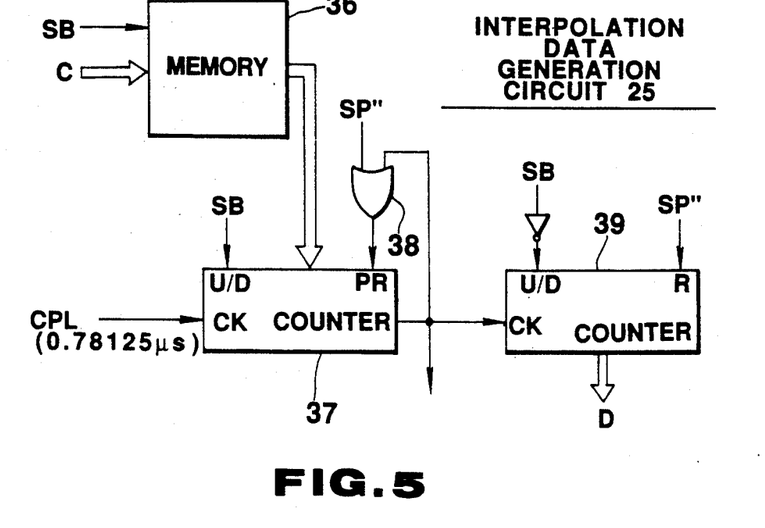
FIG. 5 is a block diagram showing another specific example of the interpolation data generation circuit in FIG. 1.

In FIG. 5, a frequency divided value memory 36 prestores, for each value that the difference C can take, frequency divided value data for dividing one period of sampling timing at substantially equal interval. The frequency divided value memory 36 stores not only absolute values of the difference C but also frequency divided value data having regard to its sign signal SB. For example, frequency divided value data corresponding to "1" of the sign signal SB, i.e., the negative direction of the movement of the object of detection, is represented by 2's complement. Data of the difference C provided by the operator 24 (FIG. 1) and its sign signal SB are applied to the frequency divided value memory 36 and frequency divided value data corresponding thereto is read from the memory 36. This frequency divided value data is applied to a preset data input of a preset type up-down counter 37.

To a present control input of this counter 37 are applied the sampling pulse SP" obtained by delaying the sampling pulse SP' by operation time of the operator 24 and read time of the memory 36 and the frequency divided output of the counter 37 through an OR gate 38. To a count input of the counter 37 is applied a clock pulse CPL taken from the least significant bit LSB of the counter 13 of FIG. 1. To an up-down control input U/D of the up-down counter 37 is applied the sign signal SB. When the sign signal SB is "0", i.e., the direction of movement of the object of detection is positive, the counter 37 is brought into a down mode whereby the clock pulse CPL is downcounted from the preset value. When the sign signal SB is "1", i.e., the direction of movement of the object of detection is negative, the counter 37 is brought into an up mode whereby the clock pulse CPL is upcounted from the preset value.

In the counter 37, frequency divided value data from the memory 36 is preset by the sampling pulse SP" at the beginning of one period of sampling timing and thereafter the clock pulse CPL is downcounted or upcounted. By downcounting or upcounting the clock pulse CPL by the number of the preset frequency divided value, the count becomes "0" and one shot of frequency divided output pulse is produced. The frequency divided value data is preset again by this frequency divided output pulse and the counting of the clock pulse CPL is continued. Interval of generation of the frequency divided output pulse from this counter 37 corresponds to time interval of one interpolation step.

The frequency divided output pulse from the conter 37 is applied to a count input of an up-down counter 39. To an up-down control input of the up-down counter 39 is applied an inverted signal of the sign signal SB which designates upcounting when it is "0", i.e., the positive direction and downcounting when it is "1", i.e., the negative direction. To a reset control input of the up-down counter 39 is applied the sampling pulse SP". The up-down counter 39 is reset by the sampling pulse SP" at the beginning of one period of sampling timing and thereupon upcounts or downcounts the frequency divided output pulse of the counter 37. When the sign signal SB is "0", i.e., the positive direction, the counter 39 performs upcounting, increasing its count by one at each one interpolation step. When the sign signal SB is "1", i.e., the negative direction, the counter 39 performs downcounting, decreasing its count by one at each interpolation step. The output of this up-down counter 39 is supplied to the operator 26 (FIG. 1) as the position interpolation data D. In the operator 26, the count of this up-down counter 39 is treated as complement data so that the count during downcounting assumes a negative value. In the same manner as described above, for enabling "0" to be provided as the position interpolation data D during the first interpolation step, the count "0" is maintained during about one period of the output pulse of the counter 37 from resetting of the counter 39 by the sampling pulse SP" at the beginning of one period of sampling timing.

By way of example of the manner of determining frequency divided value data to be stored in the frequency divided value memory 36, frequency divided value data is determined by a formula $T/C = t$, $t/d = F$ where T represents one period of sampling timing, C the number of interpolation steps, t time for one interpolation step, d one period of the clock pulse CPL for frequency dividing and F frequency divided value.

As a specific example of applying this formula, if one period of the exciting reference ac signals sin ω t and cos ω t is 100 μs and one period of sampling timing is about the same, T=100 μs. If the counter 13 is an 8-bit binary counter, period of data of the most significant bit of the counter 13 corresponds to 100 μs of the exciting reference ac signals and one period of the clock pulse CPL taken from the least significant bit LSB is 0.78125 μs. Thus, the above formula is implemented for each of various values of C (1, 2, 3, 4, 5, 6, . . . ), using values T=100 μs and d=0.78125 μs to obtain frequency divided value data corresponding to the various values of C and these frequency divided value data are stored in a memory 36. In this case, it is preferable to use an integer value which is slightly smaller than the actual result F of the operation by the above formula as the frequency divided value data rather than using the result F directly. In determining the frequency divided value data, the direction of movement, i.e., the sign signal SB, is also taken into consideration.

If, for example, C is 3, the above formula becomes $$T/C = 100/3 = 33.3 \ldots = t$$

$$t/d = 33.3 \ldots /0.78125 = 42.66 \ldots = F$$

However, the frequency divided value in the positive direction (i.e., when the sign signal SB of the difference C is "0"), for example, is determined to be "41".

The frequency divided output pulse of the counter 37 represents timing of the interpolation step and this is supplied to the incremental data generation circuit 29 (FIG. 1) also so that the incremental pulse is generated on the basis of this pulse.

In the above embodiment, previously obtained frequency divided value data is stored in the memory 36. Alternatively, this data may be obtained by operation by using a hardware or software provided exclusively for this purpose.

In the above embodiments, the interpolation operation is an estimated interpolation in which position interpolation data D obtained on the basis of difference between absolute positions of N sampling timings before and current sampling timing is added as estimated change value data to absolute position data of current sampling timing. The interpolation operation however is not limited to this but it may be a real interpolation in which position interpolation data D obtained on the basis of difference between absolute positions of N sampling timings before and current sampling timing is added as real interpolation data to absolute position data of N sampling times before. In this case, the absolute position data B of N sampling timings before provided by the memory circuit 23 and the position interpolation data D may be added together. The construction for the interpolation operation in the interpolation circuit 22 may also be modified suitably so as to perform a general real interpolation operation operation.

In the above embodiments, time interval of the interpolation step is determined freely for each sampling timing. Alternatively, the interpolation operation may be performed with a constant interpolation time interval. In this case, the incremental pulse is generated not at each interpolation step timing but at each timing of change of the interpolation data.

As described in the foregoing, according to the invention, in a position detection device comprising absolute position detection means for sampling and outputting a digital value of absolute position data of an object at each predetermined sampling timing, absolute position data can be generated with resolution which is finer than the period of sampling timing and an incremental pulse of the same high resolution can also be generated. Besides, speed response characteristic which is as high as the clock used for the interpolation operation permits can be obtained.

What is claimed is:

1. A position detection device comprising:
   an absolute position detector for sequentially detecting the absolute position of an object and generating digital data representing the detected absolute position at each of a plurality of predetermined sampling intervals having a first sampling period; and
   interpolation means responsive to the digital data generated by the absolute position detector for interpolating between position data of different ones of the plurality of predetermined sampling intervals, to derive the expected progression of said position data subsequent to a most recent one of said sampling intervals and for producing interpolated absolute position data from said derived expected progression at a plurality of intervals having an interval period less than said first sampling period.

2. A position detection device as defined in claim 1 wherein said interpolation means comprises:
   means for determining a desired number of interpolation steps as a function of the differences between position data of N prior sampling intervals as compared to the position data of current sampling;
   means for establishing a timing interval for each interpolation step based upon the determined number of interpolation steps;
   means for generating position interpolation data at each interpolation step for which the timing interval has been established; and
   means for modifying the position interpolation data with respect to the absolute position data provided by said absolute position detector for producing the interpolated absolute position data at each interpolation step.

3. A position detection device as defined in claim 1 which further comprises incremental data generation means for generating an incremental pulse train, each pulse in said pulse train corresponding to one of the plurality of intervals produced by said interpolated absolute position data from said interpolation means.

4. A position detection device as defined in claim 3 wherein said incremental data generation means generates said incremental pulse train by changing the state of an output pulse therefrom in synchronism with the timing of changes of the interpolated absolute position data produced by said interpolation means.

5. A position detection device as defined in claim 3 wherein said incremental data generation means generates said incremental pulse train by changing the state of an output pulse therefrom in accordance with the timing interval of each interpolation step produced by said interpolation means.

6. A position detection device comprising:

an absolute position detector for sequentially detecting the absolute position of an object and generating digital data representing the detected absolute position at each of a plurality of predetermined sampling intervals having a first sampling period, said absolute position detector including sensor means for phase-shifting a reference ac signal in accordance with the absolute position of said object to produce an output signal, and a circuit for repetitively measuring phase difference between the output signal of said sensor means and said reference ac signal at a sampling timing synchronized with the period of said output signal or said reference ac signal, thereby to obtain said absolute position data sampled at each said sampling timing; and interpolation means responsive to the digital data generated by the absolute position detector for interpolating between position data of different ones of the plurality of predetermined sampling intervals, to derive the expected progression of said position data subsequent to a most recent one of said sampling intervals and for producing interpolated absolute position data from said derived expected progression a plurality of intervals having an interval period less than said first sampling period.

7. A position detection device comprising:

an absolute position detector for detecting absolute position of an object and generating digital data representing a detected absolute position;

sampling means responsive to the digital data from said absolute position detector for sampling the digital data at each of a series of predetermined sampling intervals, said sampling intervals having a first period; and interpolation means responsive to the sampled digital data from said sampling means for comparing the position data of different ones of the plurality of predetermined sampling intervals received from said sampling means and for interpolating the sampled data to derive an expected change in position of the object from the most recent sampled position at a plurality of interpolation steps, to produce interpolated absolute position data at each interpolation step at intervals having a period less than said first period.

8. A position detection device as defined in claim 1 which further comprises incremental data generation means for generating an incremental pulse train in response to the interpolated absolute position data from said interpolation means.

* * * * *